United States Patent
Rajavi et al.

(10) Patent No.: US 11,573,253 B2
(45) Date of Patent: Feb. 7, 2023

(54) DIFFERENTIAL RF POWER DETECTOR WITH COMMON MODE REJECTION

(71) Applicant: Apple Inc., Cupertino, CA (US)

(72) Inventors: Yashar Rajavi, San Jose, CA (US); Sohrab Emami-Neyestanak, San Francisco, CA (US); Abbas Komijani, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 275 days.

(21) Appl. No.: 16/923,991

(22) Filed: Jul. 8, 2020

(65) Prior Publication Data

US 2022/0011352 A1 Jan. 13, 2022

(51) Int. Cl.
*H03F 3/45* (2006.01)
*G01R 21/01* (2006.01)

(52) U.S. Cl.
CPC ......... *G01R 21/01* (2013.01); *H03F 3/45479* (2013.01); *H03F 2200/451* (2013.01)

(58) Field of Classification Search
CPC ................ G01R 21/01; H03F 3/45479; H03F 2200/451; H03F 2203/45352; H03F 2203/45404; H03F 2203/45481; H03F 3/45183; H03F 3/45565; H03F 3/45488; H03F 3/45179; H03F 3/45269; H03F 3/45596; H03F 3/456; H03F 3/45609
See application file for complete search history.

(56) References Cited

U.S. PATENT DOCUMENTS

| | | | |
|---|---|---|---|
| 7,221,190 B2 | 5/2007 | Partow et al. | |
| 7,683,720 B1 * | 3/2010 | Yehui | H03F 1/483 30/304 |
| 8,274,326 B2 | 9/2012 | Boecker | |
| 9,337,779 B2 | 5/2016 | Wang et al. | |
| 9,397,623 B1 | 7/2016 | Lacroix | |

* cited by examiner

*Primary Examiner* — Jung Kim
(74) *Attorney, Agent, or Firm* — Kowert, Hood, Munyon, Rankin & Goetzel, P.C.; Erik A. Heter; Dean M. Munyon (57) ABSTRACT

A power detector circuit that rejects the common mode portion of a differential signal is disclosed. The circuit includes a differential input having first and second input nodes. Differential and common mode circuit paths are coupled to the differential input. The common mode circuit path includes first and second capacitors coupled to respective first terminals of first and second input nodes of the differential input. The second terminal of each of the first and second capacitors is coupled to a gate terminal of a first bias transistor. The common mode circuit path is configured to reject a common mode portion of a differential input signal provided to the differential input such that a differential output signal is indicative of an amount of power of a differential portion of the differential input signal.

20 Claims, 5 Drawing Sheets

DIFFERENTIAL RF POWER DETECTOR WITH COMMON MODE REJECTION

BACKGROUND

Technical Field

This disclosure is directed to electronic circuits, and more particularly, to power detectors in receiver circuits.

Description of the Related Art

Power detectors are used in many types of transmitter and receiver circuits. These power detectors may be used to detect and measure the power of a signal of interest, e.g., a radio frequency (RF) signal to be transmitted from a transmitter. The measured power may be further used to adjust the power provided by, e.g., a transmitter, in a power control loop. In another example, a signal output from an amplifier in a receiver circuit may have its power measured, and the amplification adjusted accordingly based on the measurement.

In addition to measuring the power of single-ended signals, power detectors may also be implemented to measure power of differential signals. This may include measuring the power of differential RF signals that can be transmitted or received.

SUMMARY

The present disclosure is directed to a power detector circuit that rejects the common mode portion of a differential signal. In one embodiment, the circuit includes a differential input having first and second input nodes. Differential and common mode circuit paths are coupled to the differential input. The common mode circuit path includes first and second capacitors coupled to respective first terminals of first and second input nodes of the differential input. The second terminal of each of the first and second capacitors is coupled to a gate terminal of a first bias transistor. The common mode circuit path is configured to reject a common mode portion of a differential input signal provided to the differential input such that a differential output signal is indicative of an amount of power of a differential portion of the differential input signal.

BRIEF DESCRIPTION OF THE DRAWINGS

The following detailed description makes reference to the accompanying drawings, which are now briefly described.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality, of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a common mode rejection circuit used in the measurement of differential power in differential signals. In various circuits such as transmitters and receivers, it is often times desirable to measure the power of a differential signal. However, since differential signals include a common mode portion, such measurements may be inaccurate. In particular, the common mode portion of a differential signal may induce error into the measurement of differential power, thereby preventing the measurement from determining the true differential power. The circuit disclosed herein may reject a common mode portion of a differential signal. This in turn may enable measurement of the true differential power of the differential signal.

Figure 1:
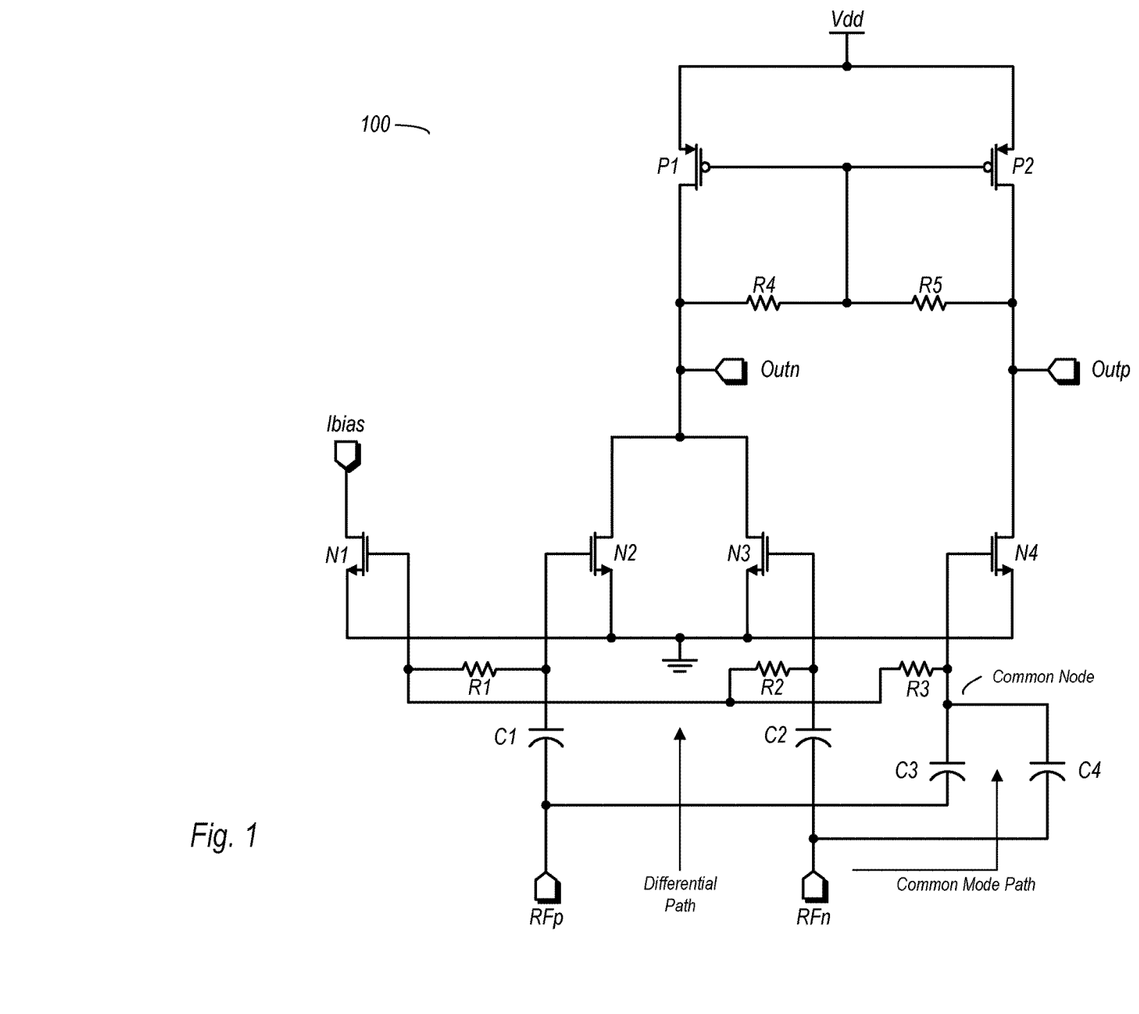
FIG. 1 is a schematic diagram of one embodiment of a circuit used to reject a common mode portion of a differential signal.

FIG. 1 is a schematic diagram of one embodiment of a circuit used to reject a common mode portion of a differential signal. In the embodiment shown, common mode rejection circuit 100 includes an input port having first and second input nodes through which components of a differential signal, respectively RFp and RFn, may be received. Similarly, the circuit includes an output port for conveying components of an output signal, the output port having first and second output nodes for conveying the components Outn and Outp, respectively. As the labeling of the input signals nodes suggests, the differential signal may be a radio frequency (RF) signal. However, use of circuit 100 with signals that are not RF signals is possible and contemplated.

Circuit 100 is coupled to receive power from a voltage source Vdd. Power is conveyed via transistors P1 and P2. The drain terminals of P1 and P2 are coupled to output terminals Outn and Outp, respectively. Resistors R4 and R5 form a divider network between the drain terminals of P1 and P2. The junction of R4 and R5 is coupled to the respective gate terminals of both P1 and P2. Through this network, power is provided for each of the output signal components through transistors P1 and P2.

Circuit 100 includes two different signal paths, a differential path and a common mode path. In the differential path, the components of the differential input signal, RFp and RFn, are conveyed to the gate terminals of transistors N2 and N3, respectively. As shown here, the input terminals for RFp and RFn are AC coupled to N2 and N3, via capacitors C1 and C2, respectively. The drain terminals of N2 and N3 are each coupled to the output terminal for the Outn component of the output differential signal.

In the common mode path, RFp and RFn are AC coupled to the gate terminal of a bias transistor N4 via capacitors C3 and C4. The drain terminal of transistor N4 is coupled to the output terminal Outp.

Circuit 100 is arranged to receive a bias current via the Ibias terminal on the drain terminal of another bias transistor, N1. Source terminals of N1, N2, N3, and N4 are each coupled to a ground node. The gate terminal of N1 is resistively coupled to the gate terminals of each of transistors N2, N3, and N4. Resistor R1 is coupled between the gate terminals of N1 and N2. Resistor R2 is coupled between the gate terminals of N1 and N3. Resistor R3 is coupled between the gate terminals of N1 and N4.

In the embodiment shown, circuit 100 may be used in the measurement of the differential power of the received differential signal. More particularly, circuit 100 in the embodiment shown may reject most or all of a common mode portion of the signal such that the measured power of the output signals is most or all differential power. The differential path as shown in FIG. 1 may sense both the differential mode and common mode portions of the differential signal conveyed thereon. In contrast, the common mode path may sense only the common mode portion of the differential signal conveyed thereon. The output signal, comprising the differential conveyed from Outp and Outn, is the delta (difference) between these two signals, which effectively rejects the input common mode. Accordingly, a signal power measurement performed of the signal conveyed from the output port of circuit 100 measures differential power minus the common mode portion, and thus measures primarily the power of the signal of interest.

When the RFp and RFn components of the differential signal are conveyed along the common mode path, they combine at the node labeled 'Common Node' in FIG. 1. When signals that are 180° out of phase with each other are combined on this node, they cancel each other. Meanwhile, the differential path is configured such that Outn is alternately driven by the components of RFp and RFn. Therefore, measuring the difference in magnitude between the signal components conveyed on Outn and Outp can be used to determine the differential power of the signal of interest. More particularly, a measurement circuit can be provided to measure the amount that the signal conveyed on the Outn node (coupled to the differential path) diverges from the signal on the Outp node (coupled to the common mode path), thereby providing a measurement circuit an indication of the magnitude and thus the differential power of the differential signal.

Figure 2:
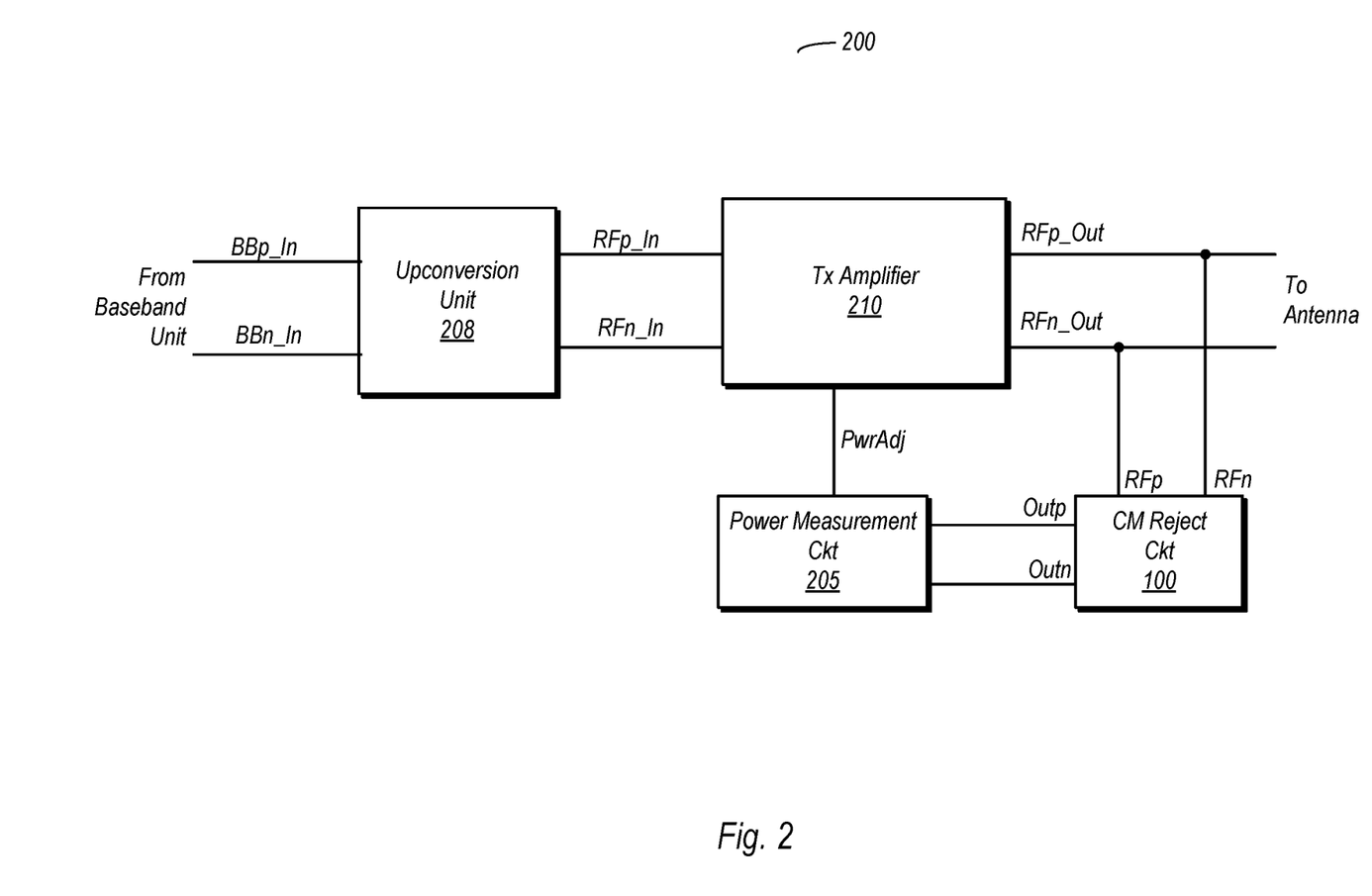
FIG. 2 is a block diagram of a transmitter having a power control loop.

FIG. 2 is a block diagram of a transmitter having a power control loop. In the embodiment shown, transmitter 200 includes an upconversion unit 208 coupled to receive a baseband differential signal from a baseband unit. The baseband differential signal (BBp_in and BBn_in) may be converted from a baseband frequency to a radio frequency (RF) in upconversion unit 208. Transmit amplifier 210 is coupled to receive a differential RF input signal, RFp_in and RFn_in, from upconversion unit 208. The output from transmit amplifier 210 is a differential RF output signal, RFp_out and RFn_out, which is an amplifier version of the differential RF input signal. This signal may be conveyed to an antenna for wireless transmission.

Transmitter 200 also includes an embodiment of a common mode rejection circuit 100, and a power measurement circuit 205. The common mode rejection circuit 100 may be an embodiment of that discussed above, and may provide a differential output signal, Outp and Outn, that is indicative of the differential power of differential signal comprising RFp_out and RFn_out. In particular, common mode rejection circuit may provide Outp and Outn as a differential signal with the common mode portion rejected therefrom in accordance with the description given above. Based on the measured power, the measurement circuit may provide an adjustment signal (Adj) to transmit amplifier 210. Based on the adjustment signal, the power of the differential output signal can be adjusted to and maintained at a desired level by transmit amplifier 210.

Figure 3:
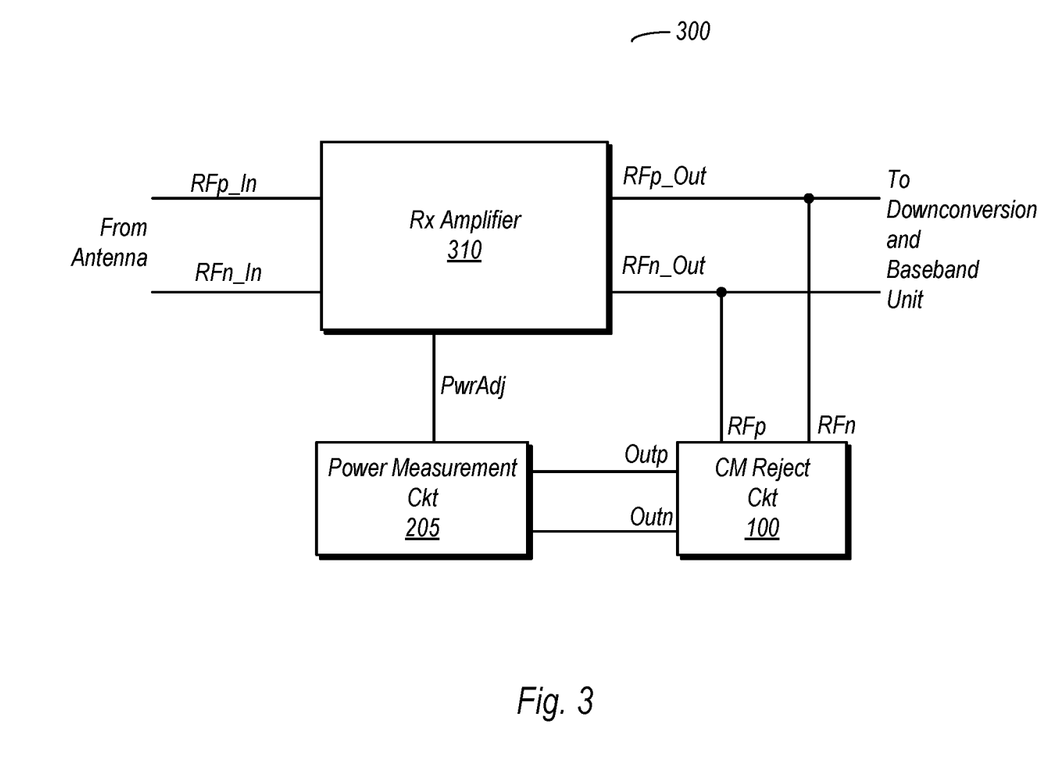
FIG. 3 is a block diagram of a receiver having a power control loop.

FIG. 3 is a block diagram of a receiver having a power control loop. In this embodiment, receiver 300 includes a receiver amplifier 310 that is coupled to receive a differential RF input signal, RFp_in and RFn_in, via an antenna. Receiver amplifier 310 amplifies the differential RF input signal to produce a differential RF output signal, RFp_out and RFp_in. This signal may be conveyed to a downconversion and baseband unit where the frequency of the signal is downconverted to a baseband frequency and further process to extract information from the carrier portion of the signal.

Similar to the transmitter system discussed above, receiver 300 includes an embodiment of a common mode rejection circuit 100, and a power measurement circuit 205. The functioning of these circuit blocks may be similar to those discussed above with reference to FIG. 2. Accordingly, through the feedback loop including common mode rejection circuit 100 and power measurement circuit 205, the amplification provided by receive amplifier 310, and thus the output power of the differential RF output signal may be adjusted to and maintained at a desired level.

Figure 4:
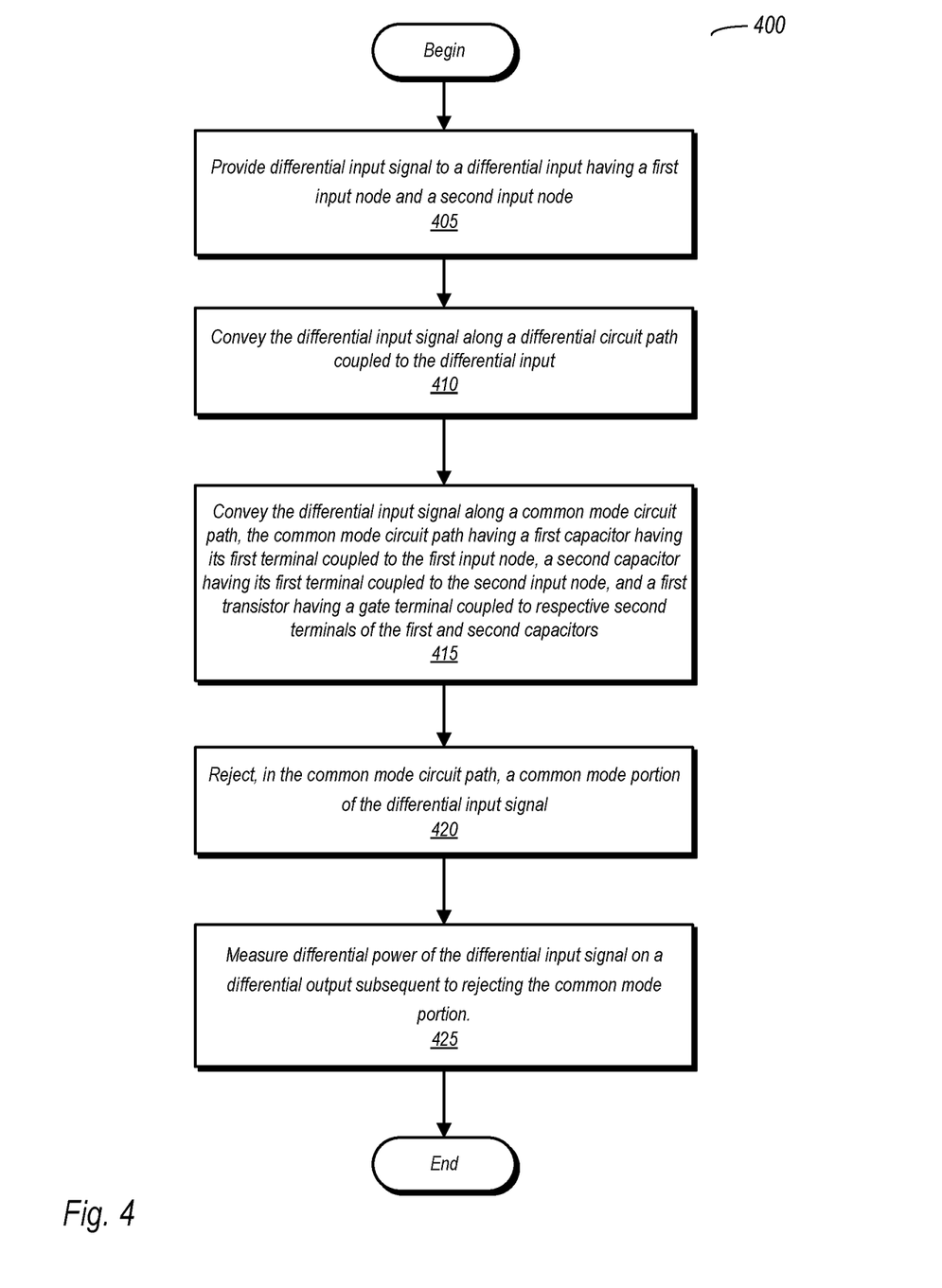
FIG. 4 is a flow diagram of one embodiment of a method for rejecting a common mode portion of a differential signal.

FIG. 4 is a flow diagram of one embodiment of a method for rejecting a common mode portion of a differential signal. Method 400 may be performed using various embodiments of the circuit discussed above in reference to FIG. 1, and in the apparatus embodiments shown in FIGS. 2 and 3. Embodiments of a circuit for rejecting a common mode portion of a differential signal not explicitly discussed herein but capable of carrying out method 400 may also fall within the scope of this disclosure.

Method 400 includes providing a differential input signal to a differential input having a first input node and a second input node (block 405). The method 400 further includes conveying the differential input signal along a differential circuit path coupled to the differential input (block 410). The differential signal may also be conveyed along a common mode circuit path, the common mode circuit path having a first capacitor having its first terminal coupled to the first input node, a second capacitor having its first terminal coupled to the second input node, and a first transistor having a gate terminal coupled to respective second terminals of the first and second capacitors (block 415). The method further includes rejecting, in the common mode circuit path, a common mode portion of the differential input signal (block 420) and measuring differential power of the differential input signal on a differential output subsequent to rejecting the common mode portion.

In various embodiments, the differential input signal is a radio frequency (RF) signal, e.g., conveyed within a transmitter or receiver. The method may thus include adjusting differential power of the differential input signal responsive to the measuring.

When carried out by a common mode rejection circuit, the method includes providing a first component of the differential input signal to a gate terminal of a second transistor and providing a second component of the differential input signal to a gate terminal of a third transistor. With respect to an output signal, the method includes providing a first component of a differential output signal on a first output node of a differential output, wherein the first output node is coupled to respective drain terminals of the second and third transistors, and further includes providing a second component of the differential output signal on a second output node of the differential output, wherein the second output node is coupled to a drain terminal of the first transistor.

Figure 5:
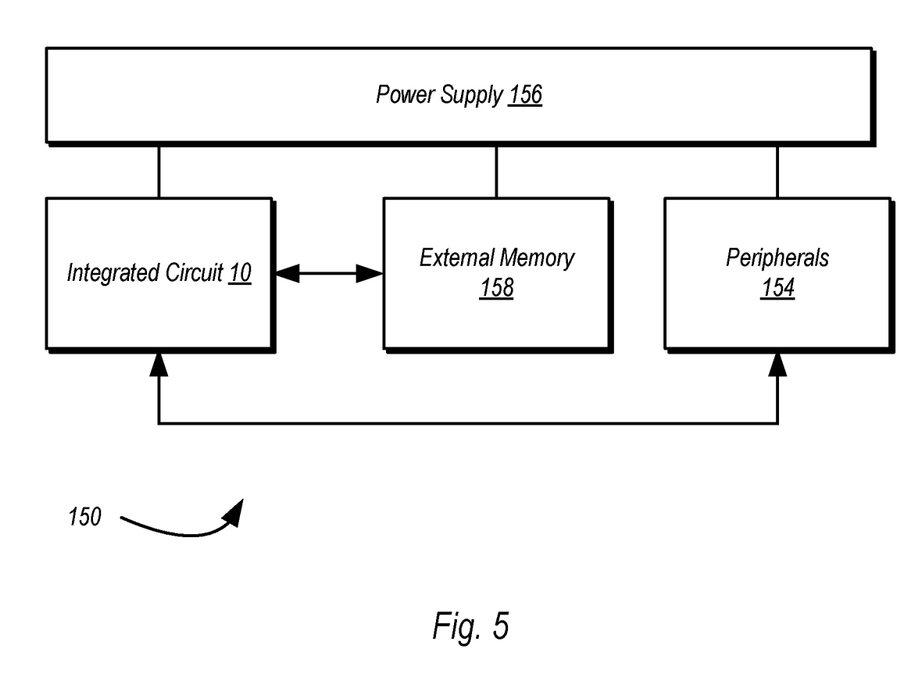
FIG. 5 is a block diagram of one embodiment of an example system.

Turning next to FIG. 5, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

In various embodiments, one or more components of system 150 may include circuits configured to convey differential signals (e.g., transmitters or receivers, such as those shown in FIGS. 2 and 3). In these circuits, the differential power of these differential signals may be measured. Accordingly, such circuits may implement various embodiments of the common mode rejection circuit discussed above to enable measurement of the true differential power of these signals.

Numerous variations and modifications will become apparent to those skilled in the art once the above disclosure is fully appreciated. It is intended that the following claims be interpreted to embrace all such variations and modifications.

What is claimed is:

1. A circuit comprising:
a differential input having a first input node and a second input node;
a differential circuit path coupled to the differential input;
a common mode circuit path coupled to the differential input, the common mode circuit path including:
a first capacitor having a respective first terminal coupled to the first input node;
a second capacitor having a respective first terminal coupled to the second input node; and
a first bias transistor having a gate terminal coupled to respective second terminals of the first and second capacitors;
wherein the common mode circuit path is configured to reject a common mode portion of a differential input signal such that a differential output signal is indicative of an amount of power of a differential portion of the differential input signal.

2. The circuit of claim 1, wherein the circuit further comprises a differential output including a first output node and a second output node.

3. The circuit of claim 2, wherein the first bias transistor includes a drain terminal coupled to the second output node.

4. The circuit of claim 2, wherein the differential circuit path includes:
a first differential transistor having a respective gate terminal coupled to receive a first component of the differential input signal; and
a second differential transistor having a respective gate terminal coupled to receive a second component of the differential input signal.

5. The circuit of claim 4, wherein the differential circuit path further includes:
a third capacitor coupled between the first input node and the respective gate terminal of the first differential transistor; and
a fourth capacitor coupled between the second input node and the respective gate terminal of the second differential transistor.

6. The circuit of claim 4, wherein the first and second differential transistors each include respective drain terminals coupled to the first output node.

7. The circuit of claim 4, further comprising a second bias transistor having a drain terminal coupled to a bias node and a source terminal coupled to a source terminal of the first bias transistor.

8. The circuit of claim 7, wherein the source terminal of the second bias transistor is further coupled to respective source terminals of the first and second differential transistors.

9. The circuit of claim 1, further comprising a measurement circuit coupled to the differential output, wherein the measurement circuit is configured to determine a differential power of the differential input signal based on the differential output signal.

10. A method, comprising:
providing a differential input signal to a differential input having a first input node and a second input node;
conveying the differential input signal along a differential circuit path coupled to the differential input;
conveying the differential input signal along a common mode circuit path, the common mode circuit path having a first capacitor having its first terminal coupled to the first input node, a second capacitor having its first terminal coupled to the second input node, and a first transistor having a gate terminal coupled to respective second terminals of the first and second capacitors;
rejecting, in the common mode circuit path, a common mode portion of the differential input signal; and
measuring differential power of the differential input signal on a differential output subsequent to rejecting the common mode portion.

11. The method of claim 10, wherein the differential input signal is a radio frequency signal.

12. The method of claim 10, further comprising adjusting differential power of the differential input signal responsive to the measuring.

13. The method of claim 10, further comprising:
providing a first component of the differential input signal to a gate terminal of a second transistor;
providing a second component of the differential input signal to a gate terminal of a third transistor; and
providing a first component of a differential output signal on a first output node of a differential output, wherein the first output node is coupled to respective drain terminals of the second and third transistors.

14. The method of claim 13, providing a second component of the differential output signal on a second output node of the differential output, wherein the second output node is coupled to a drain terminal of the first transistor.

15. An apparatus comprising:
a transmitter circuit configured to transmit a differential signal into a differential signal path;
a power detection circuit coupled to the differential signal path and configured to measure differential power of the differential signal, wherein the power detection circuit includes a common mode rejection circuit having:
a first signal path coupled to the differential signal path;
a second signal path coupled to the differential signal path, wherein the second signal path includes:
a first capacitor having a respective first terminal coupled to a first signal line of the differential signal path;
a second capacitor having a respective first terminal coupled to a second signal line of the differential signal path; and
a first transistor having a gate terminal coupled to respective second terminals of the first and second capacitors; and
wherein the second signal path is configured to reject a common mode portion of a differential input signal such that a differential output signal is indicative of an amount of power of a differential portion of the differential signal.

16. The apparatus of claim 15, wherein the power detection circuit further includes a measurement circuit coupled to an output of the common mode rejection circuit, wherein the measurement circuit is configured to measure the amount of power of the differential portion of the differential signal.

17. The apparatus of claim 16, further comprising a power control circuit configured to adjust output power of the transistor based on measurements performed by the measurement circuit.

18. The apparatus of claim 16, wherein the output of the common mode rejection circuit includes a first node and a second node, wherein the first node is coupled to a drain terminal of the first transistor.

19. The apparatus of claim 18, wherein the first path includes a second transistor coupled to a first having a respective gate terminal coupled to the first signal line and a third transistor having a respective gate terminal coupled to the second node.

20. The apparatus of claim 19, wherein the second node is coupled to respective drain terminals of the second and third transistors.

\* \* \* \* \*